United States Patent [19]

Ronay

[11] Patent Number: 5,752,875

[45] Date of Patent: May 19, 1998

[54] METHOD OF CHEMICALLY-MECHANICALLY POLISHING AN ELECTRONIC COMPONENT

[75] Inventor: Maria Ronay, Briarcliff Manor, N.Y.

[73] Assignee: International Business Machines Corporation, Armonk, N.Y.

[21] Appl. No.: 890,457

[22] Filed: Jul. 9, 1997

Related U.S. Application Data

[63] Continuation of Ser. No. 572,362, Dec. 14, 1995, abandoned.

[51] Int. Cl.$^6$ ............................................. B24B 1/00
[52] U.S. Cl. ............................................. 451/41; 451/28
[58] Field of Search ............. 451/41, 28, 285–287, 451/36, 60, 39, 40; 156/636.1; 252/79.4

[56] References Cited

U.S. PATENT DOCUMENTS

| | | | |
|---|---|---|---|
| 4,132,037 | 1/1979 | Bonora | 51/131 C |
| 4,376,148 | 3/1983 | McCartney | 428/198 |
| 4,841,680 | 6/1989 | Hoffstein et al. | 51/283 R |
| 4,879,258 | 11/1989 | Fisher | 437/225 |
| 4,910,155 | 3/1990 | Cote et al. | 437/8 |
| 4,959,113 | 9/1990 | Roberts | 156/636 |
| 5,007,128 | 4/1991 | Englund et al. | 15/230.16 |
| 5,084,071 | 1/1992 | Nenadic et al. | 51/309 |
| 5,185,964 | 2/1993 | Englund et al. | 51/281 R |
| 5,209,816 | 5/1993 | Yu et al. | 156/636 |
| 5,228,886 | 7/1993 | Zipperian | 51/293 |
| 5,264,010 | 11/1993 | Brancaleoni et al. | 51/308 |
| 5,287,663 | 2/1994 | Pierce et al. | 51/401 |
| 5,302,551 | 4/1994 | Iranmanesh et al. | 437/195 |
| 5,340,370 | 8/1994 | Cadien et al. | 51/308.03 |
| 5,396,737 | 3/1995 | Englund et al. | 451/28 |
| 5,407,526 | 4/1995 | Danielson et al. | 156/636 |
| 5,486,265 | 1/1996 | Salugsugan | 156/636.1 |
| 5,527,423 | 6/1996 | Neville et al. | 156/636.1 |
| 5,534,106 | 7/1996 | Cote et al. | 156/636.1 |
| 5,609,511 | 3/1997 | Moriyama et al. | 451/5 |

FOREIGN PATENT DOCUMENTS

| | | |
|---|---|---|
| 5-29288 | 2/1993 | Japan. |
| 6-21029 | 1/1994 | Japan. |

*Primary Examiner*—James G. Smith
*Assistant Examiner*—Derris H. Banks
*Attorney, Agent, or Firm*—Steven Capella

[57] ABSTRACT

A method of chemically polishing aluminum from a semiconductor wafer to leave a wiring pattern thereon. The surface of the aluminum in aqueous environment consists of hydrated alumina; upon contact with the hydrated silica particles of a polishing slurry at neutral pH, the surface alumina is transferred to the surface of the silica by aluminosilicate formation removing the alumina layer by layer by contact chemical reaction. Wafers thus polished have nearly scratch-free and corrosion-free polished aluminum lines in an insulator surface.

37 Claims, 3 Drawing Sheets

METHOD OF CHEMICALLY-MECHANICALLY POLISHING AN ELECTRONIC COMPONENT

This application is a continuation of U.S. application Ser. No. 08/572,362, filed Dec. 14, 1995, now abandoned and entitled "A METHOD OF CHEMICALLY-MECHANICALLY POLISHING AN ELECTRONIC COMPONENT."

FIELD OF THE INVENTION

The present invention relates to an improved surface preparation technique for semiconductor chips and, more particularly, to the planarization of such semiconductor chip surfaces according to an improved chemical-mechanical polishing technique.

BACKGROUND OF THE INVENTION

A semiconductor chip is an array of devices with conducting terminals that are interconnected by wiring patterns of metal strips. In Very Large Scale Integration (VLSI) chips, these metal wiring patterns are multilayered. Each wiring layer is separated from other conducting layers by layers of insulating material. Interconnections between different wiring pattern layers are made through holes (vias) that are etched through the insulating material layers.

As VLSI chip features shrink and the number of wiring layers increases, surface irregularities in each layer translate to subsequent layers, making each subsequent layer's surface even more irregular. These irregularities distort shapes formed on the surface, making level to level alignment difficult. In some cases, this distortion is so severe as to make it nearly impossible to adequately replicate (print) the intended shape or align printing masks to previous levels.

One prior art way surface irregularities were reduced was to fill the vias with conducting material (i.e., form studs in the vias) before printing the wiring pattern on the surface. However, the raised wire shapes on the surface still left irregularities in subsequent surfaces. Therefore, techniques were developed that are used at various levels to create a nearly perfectly flat, or, planar surface, so that shapes are printed with high dimensional and geometric accuracy. These techniques are known, in the art, as planarization.

Since the object of planarization is a perfectly smooth planar surface, in a typical planarization process, one objective is the avoidance of surface defects and, most importantly, scratches. These defects, in an otherwise planar surface, may cause shorts and may carry to subsequent levels, defeating the purpose of the planarization step. So avoiding scratches is critical to creating a near perfect planar surface. Unfortunately, most integrated circuit chip wiring is aluminum, or its alloys, which are easy to scratch. Creating a scratch-free planar surface is especially difficult for soft aluminum wiring layers.

One such planarization process is Chemical-Mechanical Polishing, also known as Chem-Mech Polishing or CMP. CMP involves applying an abrasive dispersed in a liquid (known as a slurry) to the wafer surface and then polishing the surface. Additives dissolved in the liquid phase of the slurry chemically react with the surface material, softening it. Then, typically, the highest features in the softened surface are removed by the abrasive particles. CMP is widely used to planarize dielectric layers to provide a smooth surface for printing wiring patterns.

CMP application known as the Damascene process provides a planar wiring layer surface. A layer of $SiO_2$, or another dielectric, is planarized by CMP and wiring patterns are formed in the planar surface. Then, after a conformal metal deposition, the metal surface is chem-mech polished to selectively remove metal until metal conductor remains only in the patterned recesses of the dielectric. The metal is completely removed from the dielectric surface in non-recessed areas. Presently, the Damascene process is used, when possible, to produce lines and vias for intra-chip wiring.

However, prior art CMP processes do not work well on aluminum and its alloys. In typical prior art CMP processes, additives in the liquid phase of the slurry would chemically dissolve or loosen hydrated aluminum oxide from the surface of the aluminum layer. Then, abrasive particles in the slurry, primarily, remove the dissolved hydrated aluminum oxide from the surface. Hydrated aluminum oxide is stable in a pH range between 4.5 and 8.5 as illustrated in FIG. 1. To chemically dissolve this surface oxide, the pH of the polishing slurry must be either very acidic, i.e., a pH lower than 4.5, or very alkaline, i.e., a pH higher than 8.5. So, prior art CMP slurries used on aluminum are either: alumina particles in a solution with a pH of about 2; or silica particles in a solution with a pH of 10–11. Unfortunately, the liquid in these prior art CMP slurries caused unacceptable corrosion and deep recessing of the patterned wires and vias. Therefore, the Damascene process was not used successfully, in the prior art, for planarizing aluminum wiring layers on semiconductor chips.

Prior art mechanical polishing processes did not work well either, because aluminum or aluminum alloy layers are the most difficult to polish. They are difficult because, although the metal itself is soft, a native aluminum oxide forms a hard shell on the metal's surface during the polish. If the polishing abrasive is mild, it cannot penetrate the surface oxide, making the polish ineffective. However, if the polishing abrasive used is hard enough to remove the native oxide, then it scratches the underlying softer metal. This problem is exacerbated because the hard polishing abrasives create debris by removing large aluminum particles at once. This polishing debris oxidizes instantly, which hardens it. Then, the hardened debris scratches the work piece surface.

Thus, there is a need for a polishing process for planarizing aluminum and its alloys that does not scratch the metal or the planarized surface.

PURPOSES OF THE INVENTION

It is a purpose of the present invention to remove aluminum from $SiO_2$, leaving a planar surface.

It is another purpose of the invention to chemically-mechanically polish aluminum from $SiO_2$.

It is yet another purpose of the present invention to chemically-mechanically polish aluminum from $SiO_2$ without scratching the polished surface.

It is yet another purpose of the present invention to chemically-mechanically polish aluminum from an $SiO_2$ surface of a semiconductor chip, leaving a planar surface without scratching aluminum wires formed therein.

SUMMARY OF THE INVENTION

In the preferred embodiment of the present invention, the surface of the aluminum in aqueous environment consists of hydrated alumina; upon contact with the hydrated silica particles of a polishing slurry at neutral pH, the surface alumina is transferred to the surface of the silica by aluminosilicate formation removing the alumina layer by layer by contact chemical reaction. The preferred slurry is a solution of 7.5–12.5% weight silica particles in water, neutralized with ammonia or KOH. The preferred silica particle size is 30–50 nm. This new polishing process results in scratch and corrosion free polished aluminum surfaces.

DESCRIPTION OF THE PREFERRED EMBODIMENTS

The present invention is a polishing process for removing aluminum, wherein hydrated aluminum oxide on the surface of an aluminum layer chemically reacts, upon contact, with solid polishing particles, thereby removing the surface hydrated aluminum hydroxide layer. The exposed aluminum surface then reacts with the water of the slurry, forming a new hydrated aluminum hydroxide surface layer. By removing the surface aluminum hydroxide layer, as it forms, the aluminum is removed layer by layer in the form of a compound with the solid polishing particle, without scratching the aluminum. The liquid medium acts only to hydrate the surfaces of both the polished piece and the polishing particle at neutral pH, thereby avoiding corrosion and recessing problems of the prior art.

Figure 1:
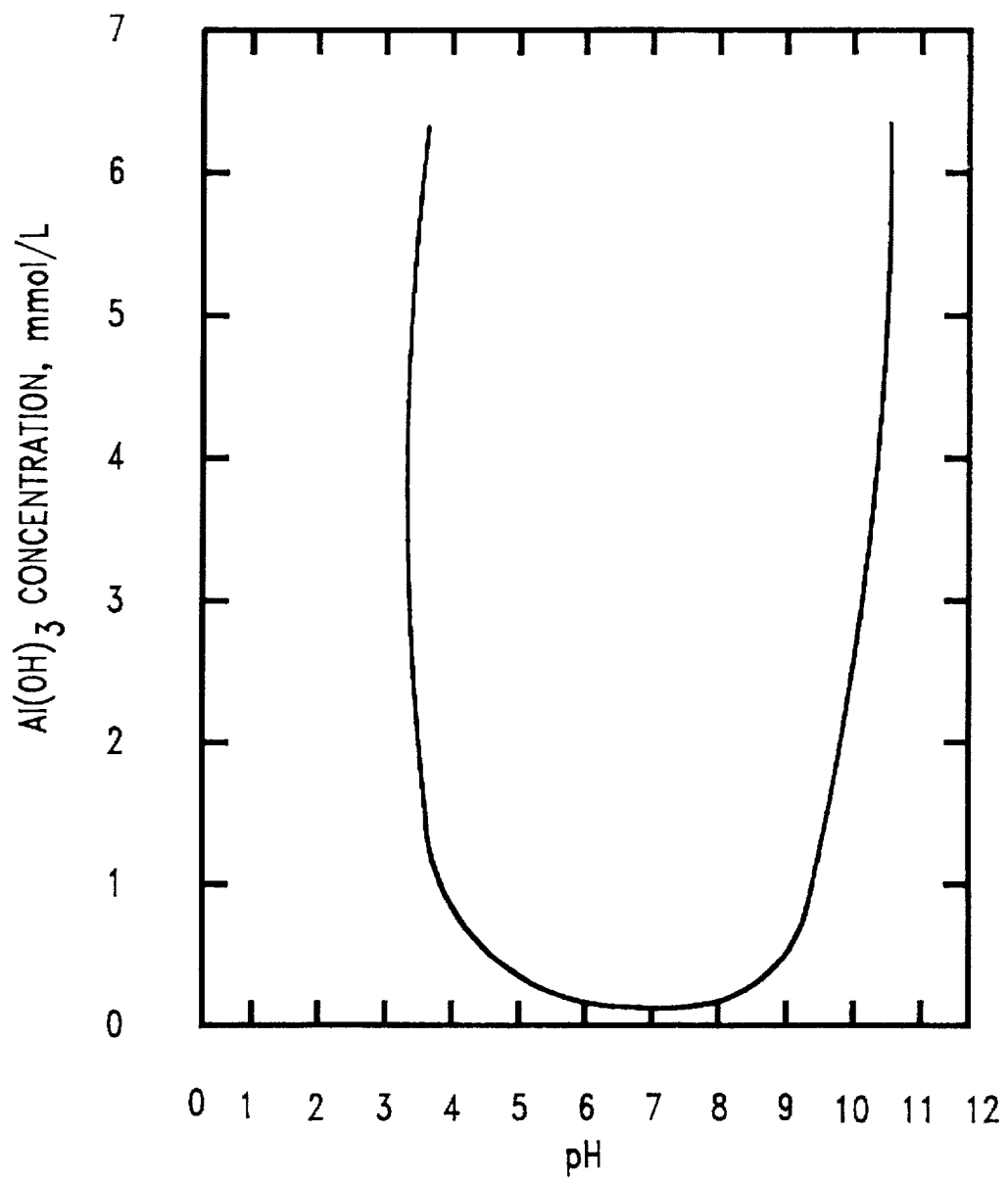
FIG. 1 is a plot of the solubility of $Al(OH)_3$ as a function of pH.
Figure 2A:
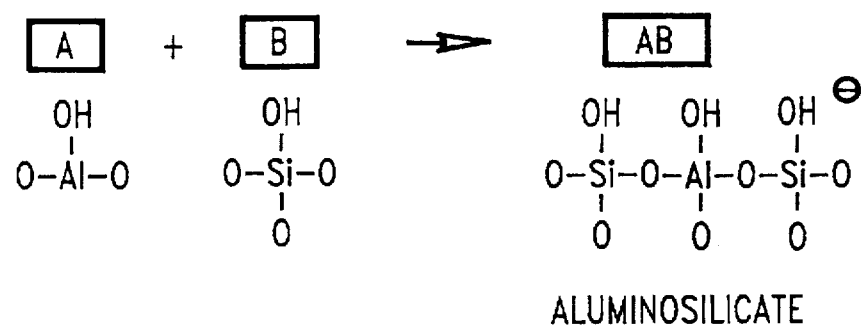
FIGS. 2A–2B diagrammatically represent the polishing mechanism of the preferred embodiment of the present invention.
Figure 2B:
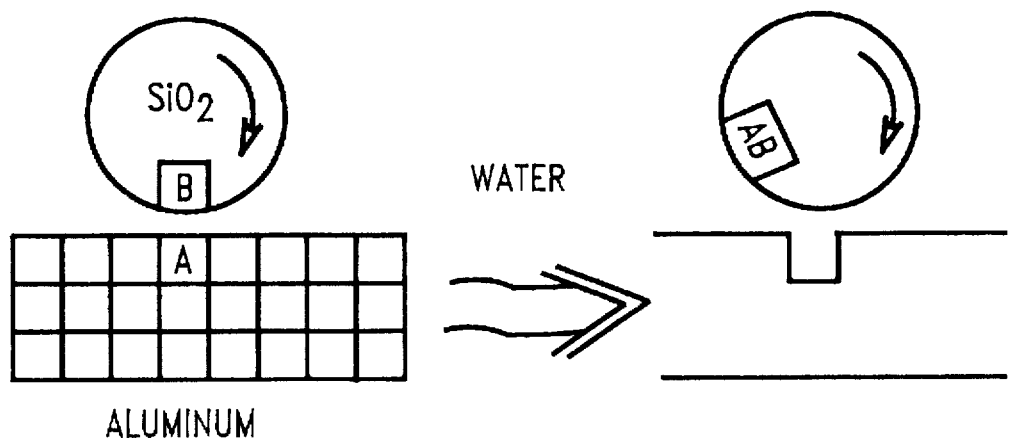

FIGS. 2A–B illustrate the mechanism of the preferred embodiment polishing process. As represented diagrammatically in FIG. 2A, the silica polishing particle B forms an aluminosilicate AB, upon contact, with hydrated aluminum oxide A on the surface of the workpiece. This reaction occurs because there is a strong specific interaction between the oxides of aluminum and silicon. Both oxides, under suitable circumstances, assume a coordination number of 4 toward oxygen, and both have approximately the same atomic diameter.

As graphically represented in FIG. 2B, the $SiO_2$ polishing particle 100 in the slurry is applied to the surface 102 of the aluminum layer 104. Since A, the aluminate ion $Al(OH)_4^{-1}$ is geometrically similar to B, $Si(OH)_4$, the aluminate ion A can be inserted or exchanged into the $SiO_2$ polishing particle surface (as represented by the arrow), thus creating an aluminosilicate site AB. AB has a fixed negative charge. Thus, the hydrated aluminum oxide A is removed from the aluminum surface 102 by inserting it (AB) into the top layer of the silica polishing particle 100. The spent polishing particle 100, with part of its surface converted to aluminosilicate AB, is discarded and replaced by new silica particles. So, layer-by-layer the surface alumina is removed without scratching the surface 102 or corroding the aluminum 104.

THE SLURRY

The silica used in the slurry, preferably, has a large surface area, and thus has a small particle size. Preferably, the silica particles are fumed silica, produced by the vapor phase hydrolysis of silicon tetrachloride in a hydrogen oxygen flame. Particles, thus formed, are dispersed in water and neutralized with ammonia or KOH. The size of the silica particles should be from 12 to 100 nanometers and preferably, about 30–50 nanometers. The silica concentration in the slurry is between 2 and 30 weight percent. The pH of the slurry is neutral, between 6–8. An acidic pH prevents formation of the aluminosilicate and an alkaline pH causes aluminum corrosion and recessing. In silica slurries with an acidic pH, i.e., of 3 or less, the aluminum reverts to 6-fold coordination, preventing aluminosilicate formation.

Alternatively, instead of fumed silica, colloidal silica may be used to polish aluminum alloys. Colloidal silica slurries produced by the hydrolysis of alcoxy-silane or by a sol-gel process are equally effective.

Normally, in the Damascene process, a liner is applied under the aluminum alloy to absorb the oxygen at via interfaces, thereby minimizing stud contact resistance. Usually, this liner is titanium, but other metals such as Cr, Molybdenum, Ti-W alloy or tungsten may also be used. Typically, the wafer, with aluminum alloy on top of the liner is heated at a temperature on the order of 500° C. This is called "reflowing" the aluminum. At this temperature, the liner and aluminum form an aluminide; $TiAl_3$ in case of titanium liner.

The mechanism of the present invention of polishing with silica slurry is based on the formation of aluminosilicate in the course of polishing. Such aluminosilicate formation only takes place if the hydrated layer forming on the exposed surface of the aluminide intermetallic in the aqueous environment is pure aluminum oxide. Such is the case with $TiAl_3$, which is polished by the silica slurry of the present invention.

If, however, the liner is Cr, Mo, Ti-W alloy, or W, and the reflow temperature is above 500° C., then $CrAl_{13}$, $MoAl_{12}$ or $WAl_{12}$ forms, respectively. $MoAl_{12}$ oxidizes to $Al_2(MoO_4)_3$ and, similarly, $WAl_{12}$ also oxidizes to a mixed W and Al oxide. Neither of these liners form an aluminosilicate and, thus, neither are polished at a fast rate by the silica slurry of the present invention.

In the Damascene process, after aluminum is deposited onto the wafer, the wafer is heated sufficiently to melt the aluminum so that it flows into recesses and voids forming a relatively uniform layer. This is known as re-flowing the aluminum or reflow. During reflow, areas of conductor arrays on chips are filled with aluminum alloy. In such an array, metal lines are spaced from each other by $SiO_2$ lines (spaces) of near equal width. During reflow, in arrays, aluminum from the surface layer flows into the trenches formed by the pattern in the $SiO_2$. Effectively, aluminum volume is lost from the layer into the trenches. Therefore, the thickness of the surface aluminum layer, i.e., above these conductor arrays, is less, by about half the trench depth, than the same layer in the chip's adjacent field areas, i.e., areas where there are no trenches. Because of this thinner aluminum layer in the arrays, polishing according to the present invention clears the aluminum from chip arrays much sooner than from adjacent fields. Thus, overpolishing in the arrays would result in eroding metal lines and narrow $SiO_2$ spaces. Further, this overpolishing would reduce conductor thickness to increase wire resistance.

However, this array overpolishing may be avoided by using a liner in the array of Cr, Mo, W or Ti-W alloy. As noted above, their aluminides are polished slowly enough by the silica slurry to act as polish stops. This is an advantageous characteristic of the preferred embodiment polishing process.

THE PAD

In the preferred embodiment polishing process of the present invention, as represented in FIGS. 2A–B, the alumina on the surface of the aluminum chemically reacts with the surface of the silica polishing particle. Therefore, it is intended that the polishing pad assures contact between the silica polishing particles and the alumina.

Figure 3:
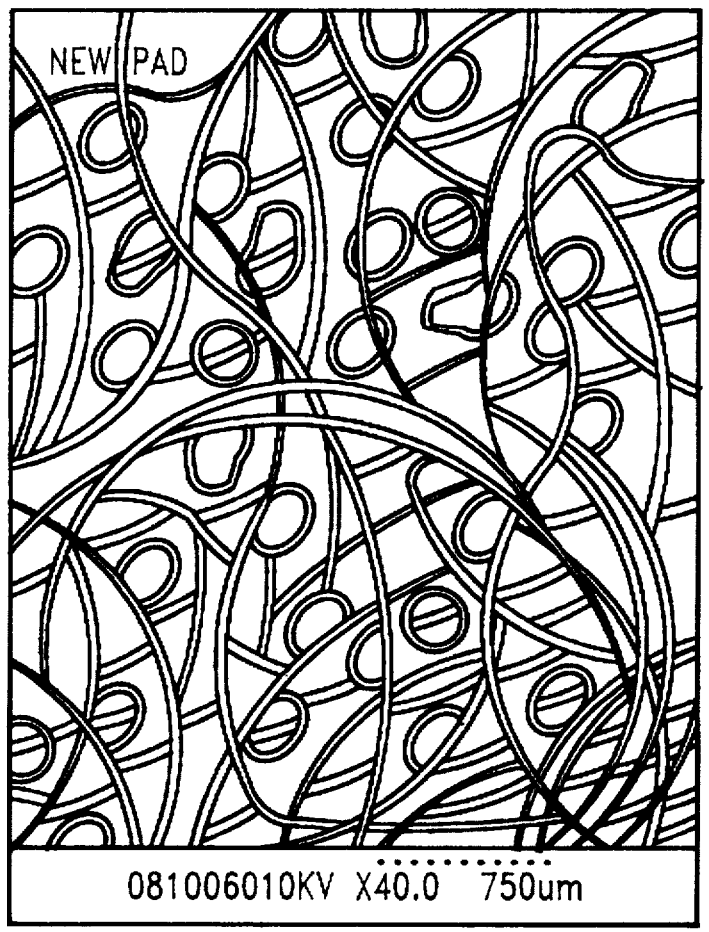
FIG. 3 shows the surface of a preferred pad for contact chemical reaction polishing.

FIG. 3 is a Scanning Electron Microscope (SEM) picture of such a preferred polishing pad. In making a pad such as this, rayon fibers are laid down and held together by a binder. The binder is preferably, an acrylic-butadien rubber copolymer. The laid-down fibers create tracks, like those of a bobsled run, wherein the slurry particles roll around upon shear from the pad, thereby providing a maximum surface contact between the polishing particles and the alumina surface. Because of the openness of this pad structure, slurry particles are not pressed into the aluminum surface and, therefore, only mild mechanical abrasion takes place. The pad surface geometry insures a contact-chemical reaction between the polishing particles and the surface to be polished.

Alternative preferred embodiment polishing pads are, for example, napped poromeric synthetics such as a polyurethane foam with a vertically oriented pore structure. The backing is preferably soft and thin, to prevent scratches and reduce dishing. Two such backings are mylar and felt. Examples of such alternate preferred embodiment pads are the DF200II (which has a mylar backing) and Meritex (which is felt-backed) polyurethane pads, both from Rodel.

AN EXAMPLE

Eight inch diameter patterned aluminum films were polished on a Westech 372 polishing machine. The polishing slurry consisted of 7.5 wt % aqueous dispersion of 30 nanometer fumed silica at pH=6.7, applied at a rate of 200 ml per minute. The pad used was that in FIG. 3. A down force of 6 psi was applied to the pad. The platen speed was 100 rpm and the carrier speed was 10 rpm. The resulting aluminum polishing rate was 150 nanometers per minute. The $SiO_2$ removal rate was 10 nanometers per minute. The resulting polished surface was free of scratches, corrosion and chemical recesses. Electrical testing of the polished work piece detected no unwanted opens or shorts.

While the present invention is described in terms of preferred embodiments, it is understood that numerous variations and modifications will occur to a person skilled in the art without departing in spirit from the claimed invention. It is intended that the scope of the claims include those modifications and variations that fall within the spirit of the invention.

I claim:

1. A method of forming shapes in a soft metal layer comprising aluminum on a dielectric layer, said method comprising the steps of:
   a) applying a slurry to a surface of said metal layer to form an essentially pure hydrated aluminum oxide layer thereon, said slurry being an aqueous dispersion of silica particles;
   b) rotatably applying a polishing pad to said slurry on said metal layer to cause said slurry particles to contact said hydrated aluminum oxide layer;
   c) forming a removable aluminosilicate species; and,
   d) polishing said metal layer from said dielectric layer until said shapes are formed from said metal layer.

2. The method of claim 1 wherein the slurry is applied to said wafer during the polishing step (c).

3. The method of claim 1 wherein said dielectric layer is a layer of a semiconductor wafer.

4. The method of claim 3 wherein said wafer is rotated during the polishing step (c).

5. The method of claim 3 wherein the slurry is applied to said wafer during the polishing step (c).

6. The method of claim 1 wherein the silica particles comprise is fumed silica formed by vapor phase hydrolysis of silicon tetrachloride in a hydrogen-oxygen flame and neutralized with ammonia.

7. The method of claim 1 wherein the silica particles comprise colloidal silica formed by a sol-gel process.

8. The method of claim 1 wherein the silica particles comprise colloidal silica formed by the hydrolysis of alcoxy-silane.

9. The method of claim 1 wherein the silica particles have a particle size between 12 and 100 nm.

10. The method of claim 9 wherein the silica particles have a particle size of 30–50 nm.

11. The method of claim 1 wherein the silica particles are from 2 to 30% weight of said slurry.

12. The method of claim 11 wherein the silica particles are 7.5–12.5% weight of said slurry.

13. The method of claim 1 wherein the slurry has a pH between 6 and 8.

14. The method of claim 1 wherein the silica particles comprise fumed silica formed by vapor phase hydrolysis of silicon tetrachloride in a hydrogen-oxygen flame and neutralized with KOH.

15. A method of forming shapes in a soft metal layer comprising aluminum on a dielectric layer, said method comprising the steps of:
   a) applying a slurry to a surface of said metal layer to form an essentially pure hydrated aluminum oxide layer thereon, said slurry being an aqueous dispersion of silica particles, said slurry consisting of:
   silica particles,
   water, and
   an agent for raising the slurry pH to a neutral pH;
   b) rotatably applying a polishing pad to said slurry on said metal layer to cause said slurry particles to contact said hydrated aluminum oxide layer;
   c) forming a removable aluminosilicate species; and,
   d) polishing said metal layer from said dielectric layer until said shapes are formed from said metal layer.

16. The method of claim 15 wherein the silica particles in the slurry are fumed silica formed by vapor phase hydrolysis of silicon tetrachloride in a hydrogen-oxygen flame, and the agent for raising the slurry pH is selected from the group consisting of ammonia or KOH.

17. The method of claim 15 wherein the silica particles in the slurry are formed by a sol-gel process.

18. The method of claim 15 wherein the silica particles in the slurry are formed by hydrolysis of alcoxy-silane.

19. The method of claim 15 wherein the silica particles in the slurry have a particle size between 12 and 100 nm.

20. The method of claim 19 wherein the silica particles in the slurry have a particle size of 30–50 nm.

21. The method of claim 15 wherein the silica particles in the slurry are from 2 to 30% weight of said slurry.

22. The method of claim 21 wherein the silica particles in the slurry are 7.5–12.5% weight of said slurry.

23. The method of claim 15 wherein the slurry has a pH between 6 and 8.

24. The method of claim 15 wherein the polishing pad is a soft polishing pad said soft polishing pad comprises:
   rayon fiber; and,
   a binder holding said rayon fibers together.

25. The method of claim 24 wherein said binder is an acrylic-butadien rubber copolymer.

26. The method of claim 15 wherein the polishing pad is a soft polishing pad comprised of polyurethane poromeric foam on a felt backing.

27. The method of claim 15 wherein the polishing pad is a soft polishing pad comprised of polyurethane poromeric foam on a mylar backing.

28. A method of forming shapes in a soft metal layer comprising aluminum on a dielectric layer, said method comprising the steps of:

a) applying a slurry to a surface of said metal layer to form an essentially pure hydrated aluminum oxide layer thereon, said slurry being an aqueous dispersion of silica particles and having a pH between 6 and 8, said slurry consisting of;

silica particles having a particle size between 12 and 100 nm and being from 2–30% weight of said slurry, water, and an agent for raising the slurry pH selected from the group consisting of ammonia or KOH;

b) rotatably applying a polishing pad to said slurry on said metal layer to cause said slurry particles to contact said hydrated aluminum oxide layer;

c) forming a removable aluminosilicate species; and, d) polishing said metal layer from said dielectric layer until said shapes are formed from said metal layer.

29. The method of claim 28 wherein the silica particles in the slurry are fumed silica formed by vapor phase hydrolysis of silicon tetrachloride in a hydrogen-oxygen flame, and neutralized with ammonia.

30. The method of claim 28 wherein the silica particles in the slurry are formed by a sol-gel process.

31. The method of claim 28 wherein the silica particles in the slurry are formed by hydrolysis of alcoxy-silane.

32. The method of claim 28 wherein the silica particles in the slurry have a particle size of 30–50 nm.

33. The method of claim 28 wherein the silica particles in the slurry are 7.5–12.5% weight of said slurry.

34. The method of claim 28 wherein the polishing pad is a soft polishing pad said soft polishing pad comprises:

rayon fiber; and, an acrylic-butadien rubber copolymer binder holding said rayon fibers together.

35. The method of claim 28 wherein the polishing pad is a soft polishing pad comprised of polyurethane poromeric foam on a felt backing.

36. The method of claim 28 wherein the polishing pad is a soft polishing pad comprised of polyurethane poromeric foam on a mylar backing.

37. The method of claim 28 wherein the silica particles in the slurry are fumed silica formed by vapor phase hydrolysis of silicon tetrachloride in a hydrogen-oxygen flame, and neutralized with KOH.

\* \* \* \* \*